United States Patent
Lin et al.

(10) Patent No.: US 6,787,781 B1
(45) Date of Patent: Sep. 7, 2004

(54) ARC CHAMBER FILAMENT FOR ION IMPLANTER

(75) Inventors: Hom-Chung Lin, Wuci Township (TW); Mei-Lan Hung, Tainan County (TW); Chi-Fu Yu, Taipei (TW); Shin-Ho Tzeng, Kaolsiung County (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/671,088

(22) Filed: Sep. 24, 2003

(51) Int. Cl.⁷ ................................. H01J 37/36
(52) U.S. Cl. ..................................... 250/426; 250/423 R
(58) Field of Search ............................ 250/423 R, 424, 250/426

Primary Examiner—Nikita Wells
Assistant Examiner—Erin-Michael Gill
(74) Attorney, Agent, or Firm—Tung & Associates

(57) ABSTRACT

An arc chamber filament for an ion implanter used to implant ions in a semiconductor wafer substrate during the fabrication of integrated circuits on the substrate. The filament includes a pair of parallel filament segments each of which is connected to a voltage source at one end. The parallel filament segments are connected to each other through a bidirectional winding configuration which defines at least one generally U-shaped winding unit on each side of a plane of symmetry bisecting the filament.

20 Claims, 2 Drawing Sheets

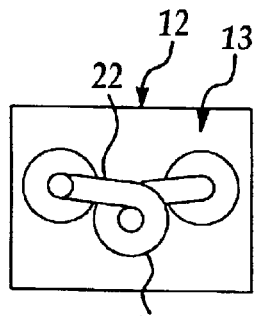
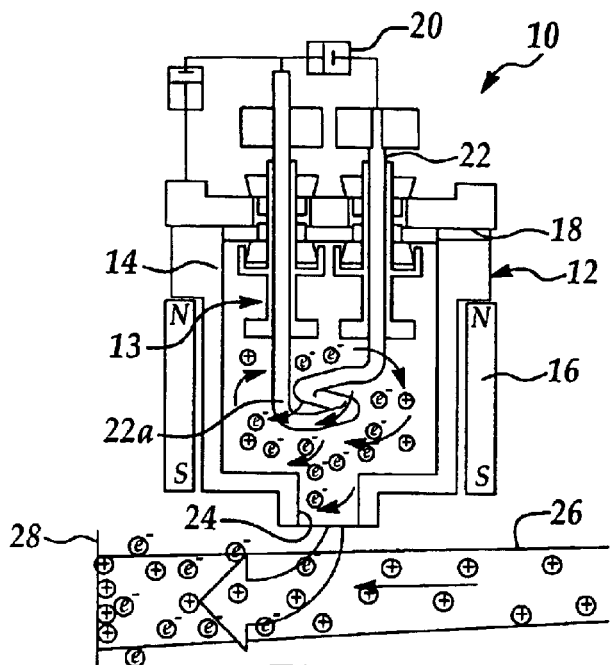
*Figure 1A*
*Prior Art*
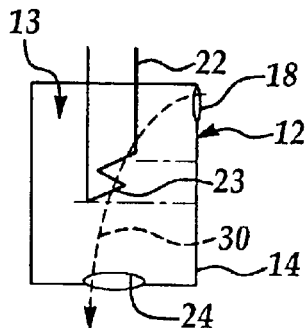
*Figure 1*
*Prior Art*
*Figure 1B*
*Prior Art*
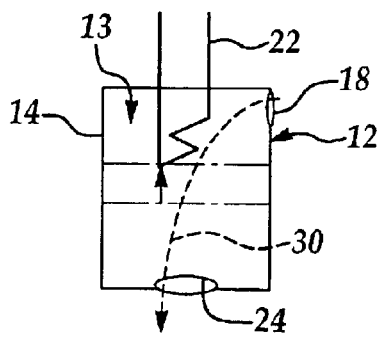
*Figure 1C*
*Prior Art*
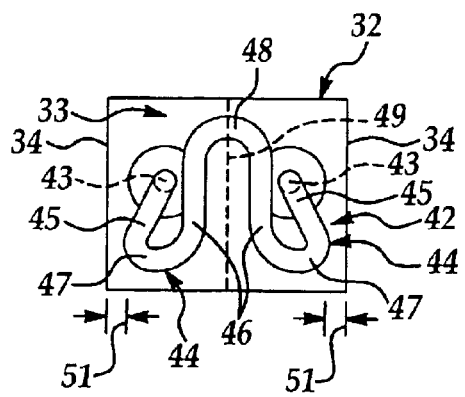
*Figure 2*
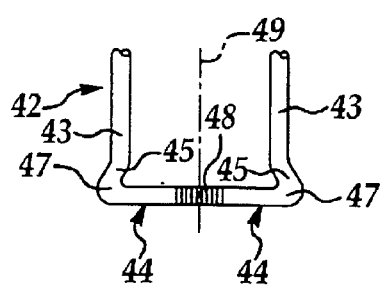
*Figure 2A*

ARC CHAMBER FILAMENT FOR ION IMPLANTER

FIELD OF THE INVENTION

The present invention relates to hi-current implanters used to implant ions in semiconductor wafer substrates in the fabrication of semiconductor integrated circuits. More particularly, the present invention relates to a new and improved hi-current implanter arc chamber filament which is characterized by an extended lifetime.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Ion implantation is another processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the substrate. Finally, the doped silicon substrate is subjected to a thermal anneal step to activate the dopant ions.

A phenomenon which commonly results from the ion implantation process is wafer charging, in which positive ions from the ion beam strike the wafer and accumulate in the masking layer. This can cause an excessive charge buildup on the wafer, leading to charge imbalances in the ion beam and beam blow-up, which results in substantial variations in ion distribution across the wafer. The excessive charge buildup can also damage surface oxides, including gate oxides, leading to device reliability problems, as well as cause electrical breakdown of insulating layers within the wafer and poor device yield.

Wafer charging is controlled using a plasma flood system, in which the wafer is subjected to a stable, high-density plasma environment. Low-energy electrons are extracted from an argon or xenon plasma in an arc chamber and introduced into the ion beam, which carries the electrons to the wafer so that positive surface charges on the wafer are neutralized. The energy of the electrons is sufficiently low to prevent negative charging of the wafer.

A typical conventional PFS (plasma flood system) for neutralizing positive charges on ion-implanted wafers is generally indicated by reference numeral 10 in FIG. 1 and includes an arc chamber 12 having a cylindrical chamber wall 14. A single gas inlet opening 18 is provided in the chamber wall 14. A low voltage source 20 generates a typically 3-volt, 200-amp current through a tungsten filament 22 positioned in the chamber interior 13. As shown in FIGS. 1 and 1A, the filament 22 typically forms a single filament loop 22a in the chamber interior 13. Pressure inside the chamber interior 13 is maintained at about 5 Torr. Simultaneously, by operation of vacuum pressure applied through a vacuum opening 24 in the bottom of the arc chamber 12, a plasma-forming gas such as argon or xenon is introduced into the chamber interior 13 through the single gas opening 18, at a flow rate of typically about 1.2 sccm. The filament 22, heated by the low-voltage current from the current source 20, causes thermionic emission of electrons from the flowing gas as the gas contacts the filament 22. The electrons from the gas are electrically attracted to the positively-charged chamber walls 14, which function as an anode. A toroidal magnet 16 generates a magnetic field which causes the electrons to travel in a spiral flight path in the chamber interior 13, and this increases the frequency of collisions between the electrons and the gas atoms, resulting in the creation of additional free electrons. The electrons and positive ions are drawn from the chamber interior 13 through the vacuum opening 24, where the electrons and cations enter an ion beam 26. The ion beam 26 carries the electrons into contact with a semiconductor wafer 28 which was previously subjected to an ion implantation process. Accordingly, the electrons contact the wafer 28 and neutralize positive ions remaining on the surface of the wafer 28 after the ion implantation process.

A common characteristic of the conventional arc chamber 12 is that the single gas inlet opening 18 facilitates orderly spiral flow of the argon or xenon gas in the chamber interior 13. Consequently, the plasma-forming gas continually contacts the same point or points on the filament 22 in transit to the vacuum opening 24. This is illustrated in FIG. 1B, in which the flowing gas continually contacts the same point 23 on the filament 22 and, after a relatively short period of operation, causes burnout and breakage of the filament 22 at the point of contact 23. Consequently, the filament 22 must be replaced typically after about 10 days of operation.

As illustrated in FIG. 1C, one way to prevent continuous contact of the gas with the burnout-prone points on the filament 22 is to raise the position of the filament 22 in the chamber interior 13. However, when the filament 22 is disposed in this raised configuration, much of the gas fails to adequately contact the filament 22 for emission of electrons from the gas, as shown by the gas flow path 30. Accordingly, a new and improved arc chamber filament for an ion implanter is needed which resists burnout and is characterized by enhanced longevity.

An object of the present invention is to provide a new and improved filament suitable for an arc chamber of an ion implanter.

Another object of the present invention is to provide a new and improved arc chamber filamant which is characterized by enhanced longevity.

Still another object of the present invention is to provide a new and improved arc chamber filament which reduces the costs associated with maintenance of an ion implanter.

Yet another object of the present invention is to provide a new and improved arc chamber filament which contributes to enhanced ion beam quality in an ion implanter.

A still further object of the present invention is to provide a new and improved arc chamber filaments having novel configurations which render the filaments less susceptible to burnout and breakage.

Yet another object of the present invention is to provide a new and improved arc chamber filament which may be shaped to include at least one generally U-shaped winding unit on each side of a plane of symmetry extending through the filament.

Another object of the present invention is to provide a new and improved arc chamber filament which does not damage arc chamber shielding.

SUMMARY OF THE INVENTION

In accordance with these and other objects and advantages, the present invention is generally directed to a new and improved arc chamber filament for an ion implanter used to implant ions in a semiconductor wafer substrate during the fabrication of integrated circuits on the substrate. The filament includes a pair of parallel filament segments each of which is connected to a voltage source at one end. The parallel filament segments are connected to each other through a bidirectional winding configuration which defines at least one generally U-shaped winding unit on each side of a plane of symmetry bisecting the filament.

BRIEF DESCRIPTION OF THE DRAWINGS

The invention will now be described, by way of example, with reference to the accompanying drawings, in which:

FIG. 1 is a cross-sectional, partially schematic, view of an arc chamber for a current implanter, with an arc filament of conventional shape mounted in the arc chamber;

FIG. 1A is a bottom view of the conventional arc filament shown in FIG. 1;

FIG. 1B is FIG. 2A illustrates a typical gas flow path in operation of a single-inlet arc chamber of a conventional plasma flood system;

FIG. 1C illustrates raising of a filament in a single-inlet arc chamber of a conventional plasma flood system to prevent continuous contact of a gas with the same point or points on the filament and premature burnout and breakage of the filament;

FIG. 2 is a bottom view of an illustrative embodiment of the arc chamber filament in accordance with the present invention, mounted in an arc chamber of an ion implanter;

FIG. 2A is a front view, partially in section, of the filament of FIG. 2;

DESCRIPTION OF THE PREFERRED EMBODIMENTS

The present invention is generally directed to a new and improved filament for an arc chamber of an ion implanter used to implant ions in semiconductor wafer substrates during the fabrication of integrated circuits. The filament is shaped in a novel configuration which renders the filament less susceptible to premature burnout, thus reducing the replacement frequency and costs associated with maintaining ion implanters. The filament includes a pair of generally parallel segments which are connected to each other through a winding configuration having at least one generally U-shaped winding unit on each side of a plane of symmetry extending through the filament.

Figure 5:
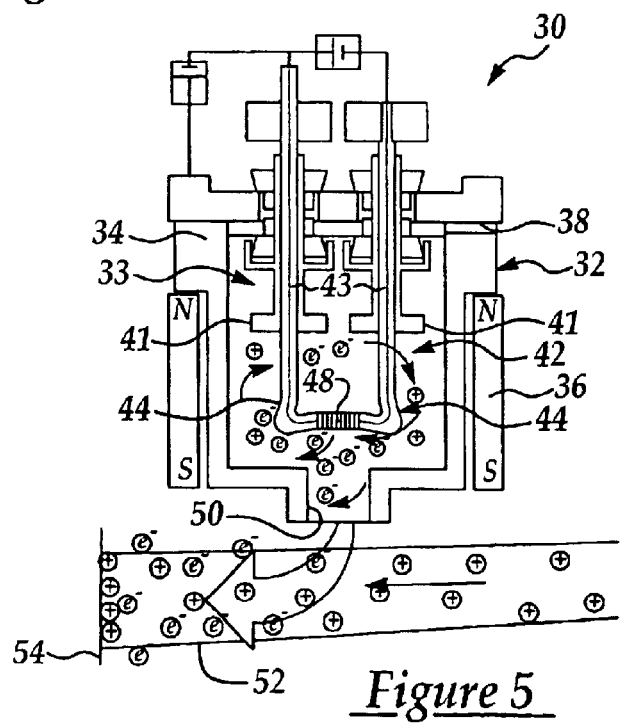
FIG. 5 is a cross-sectional, partially schematic, view of an arc chamber incorporating the arc chamber filament shown in FIG. 2, in application of the invention.

Referring initially to FIGS. 2, 2A and 5, an illustrative embodiment of the arc chamber filament of the present invention is generally indicated by reference numeral 42. The filament 42 is adapted for an arc chamber 32 of a plasma flood system 30, as shown in FIG. 5, of an ion implanter (not shown) such as a Varian EHP 500 ion implanter used in the semiconductor industry to implant ions in semiconductor wafer substrates. The arc chamber 32 includes a cylindrical chamber wall 34 that defines a chamber interior 33. A gas inlet opening 38 is provided in the chamber wall 34.

As shown in FIGS. 2 and 2A, the filament 42 includes a pair of elongated parallel segments 43 which extend through a pair of respective filament holders 41 (FIG. 5) in the chamber interior 33. Each of the parallel segments 43 is connected to a low voltage source 40. As shown in FIGS. 2 and 2A, the parallel segments 43 of the filament 42 are connected by a pair of winding filament units 44 which are connected by a bridge segment 48. The winding filament units 44 each have a generally "U"-shaped configuration and are symmetrical with each other on opposite sides of an imaginary plane of symmetry 49 which extends through the bridge segment 48. As particularly shown in FIG. 2, each of the winding filament units 44 includes a proximal segment 45 which extends from each corresponding parallel segment 43 typically at substantially a 90-degree angle. A distal segment 46 is joined to the proxmial segment 45 through a filament bend 47. The proximal segment 45 and the distal segment 46 extend adjacent to each other typically in substantially the opposite directions and in substantially the same plane. The distal segments 46 of the winding filament units 44 are connected to each other by the bridge segment 48, through which the imaginary plane of symmetry 49 extends. As shown in FIG. 2, when mounted in the chamber interior 33, the filament 42 is spaced from the chamber wall 34 across a gap 51 which is the same on each side of the chamber interior 33. The various elements of the filament 42 are typically solid tungsten and the filament 42 may have a diameter of typically about 1.88 mm.

Referring again to FIG. 5, in application of the filament 42 the low voltage source 40 generates a typically 3-volt, 200-amp current through the filament 42 positioned in the chamber interior 33. Pressure inside the chamber interior 33 is maintained at typically about 5 Torr. Simultaneously, by operation of vacuum pressure applied through a vacuum opening 50 in the bottom of the arc chamber 32, a plasma-forming gas such as argon or xenon is introduced into the chamber interior 33 through the gas opening 38 at a flow rate of typically about 1.2 sccm. The filament 42 is heated by the low-voltage current from the current source 40 and causes thermionic emission of electrons from the flowing gas as the gas contacts the filament 42. The electrons from the gas are electrically attracted to the positively-charged chamber walls 34, which function as an anode. A toroidal magnet 36 generates a magnetic field which causes the electrons to travel in a spiral flight path in the chamber interior 33, and this increases the frequency of collisions between the electrons and the gas atoms, resulting in the creation of additional free electrons. The electrons and positive ions are drawn from the chamber interior 33 through the vacuum opening 50, where the electrons and cations enter an ion beam 52. The ion beam 52 carries the electrons into contact with a semiconductor wafer 54 which was previously subjected to an ion implantation process. Accordingly, the electrons contact the wafer 54 and neutralize positive ions remaining on the surface of the wafer 54 after the ion implantation process.

It will be appreciated by those skilled in the art that the unique configuration imparted to the filament 42 by the symmetrical winding filament segments 44, in combination with the equal spacing 51 of the respective winding filament units 44 with respect to the chamber wall 34, balances the voltage between the filament 42 and the chamber wall 34 when the low voltage source 40 applies current to the filament 42. This prevents premature burnout of the filament 42 as the flowing gas contacts the filament 42 and extends the lifetime of the filament 42 by as much as 35%.

Figure 3:
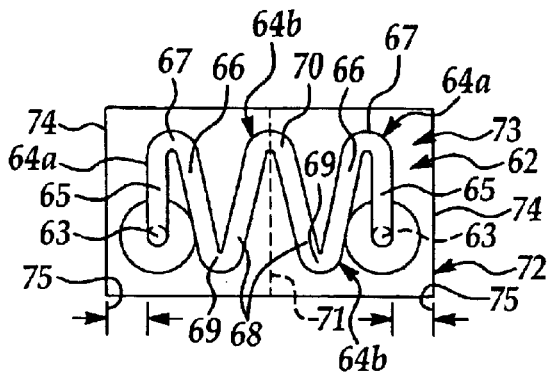
FIG. 3 is a bottom view of another illustrative embodiment of an arc chamber filament in accordance with the present invention, mounted in an arc chamber of an ion implanter.
Figure 3A:
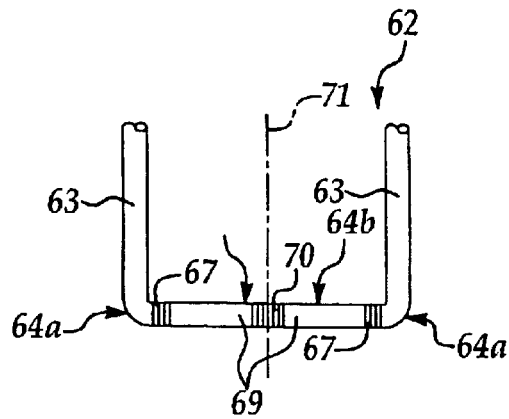
FIG. 3A is a front view, partially in section, of the filament of FIG. 3.

Referring next to FIGS. 3 and 3A, in an alternative embodiment the filament 62 includes a pair of winding filament units 64a, 64b on each side of a plane of symmetry 71 that extends through a bridge segment 70 connecting the symmetrical winding filament segments 64b to each other. Each winding filament unit 64a is continuous with a corresponding parallel segment 63, as shown in FIG. 3A. The filament 62 is mounted in a chamber interior 73 of an arc chamber 72 in an ion implanter, as heretofore described with respect to the filament 42 of FIGS. 2, 2A and 5.

As shown in FIG. 3, each winding filament unit 64a includes a proximal segment 65 which extends from the corresponding parallel segment 63 typically in substantially perpendicular relationship thereto, and a middle segment 66 which is connected to the proximal segment 65 through a proximal bend 67. The proximal segment 65 and the middle segment 66 extend in substantially the opposite directions in substantially the same plane. Each winding segment 64b includes the middle segment 66 and a distal segment 68 which is connected to the middle segment 66 through a distal bend 69. The distal segments 68 of the respective winding filament units 64b are connected to each other through the bridge segment 70. When mounted in the chamber interior 73 of the arc chamber 72, the filament 62 is separated from the chamber wall 74 on opposite sides of the arc chamber 72 by gaps 75 of the same magnitude. Accordingly, the winding configuration of the filament 62, in combination with the gaps 75 of equal spacing between the chamber wall 74 and each side of the filament 62, facilitate balanced voltages between the chamber wall 74 and the filament 62, resulting in prolonged lifetime of the filament 62.

Figure 4:
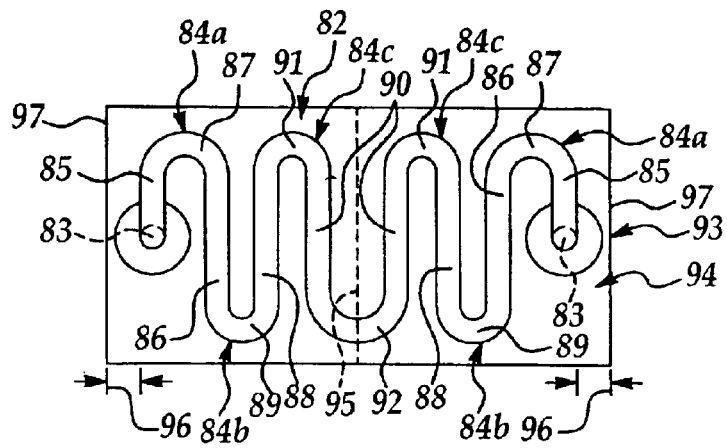
FIG. 4 is a bottom view of still another illustrative embodiment of an arc chamber filament in accordance with the present invention, mounted in an arc chamber of an ion implanter.
Figure 4A:
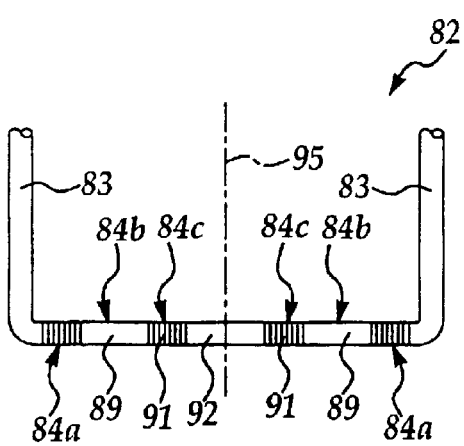
FIG. 4A is a front view, partially in section, of the filament of FIG. 4.

Referring next to FIGS. 4 and 4A, in still another embodiment the filament 82 includes three winding filament units 848, 84b, 84c on each side of a plane of symmetry 95 that extends through a bridge segment 92 connecting the symmetrical winding filament units 84c to each other. Each winding filament unit 84a is continuous with a corresponding parallel segment 83, as shown in FIG. 4A. The filament 82 is mounted in a chamber interior 94 of an arc chamber 93 in an ion implanter.

As shown in FIG. 4, each winding filament unit 84a includes a proximal segment 85 which extends from the corresponding parallel segment 83 typically in substantially perpendicular relationship thereto. An extending segment 86 of the winding filament unit 84a is connected to the proximal segment 85 through a proximal bend 87. The extending segment 86 and the proximal segment 85 typically extend in opposite directions and in a substantially common plane. Each winding segment 84b includes the extending segment 86 and a return segment 88 which is connected to the extending segment 86 through a middle bend 89. The extending segment 86 and the return segment 88 typically extend in opposite directions and in a substantially common plane. Each winding segment 84c includes the return segment 88 5 and the distal segment 90 which is connected to the return segment 88 through a distal bend 91. The return segment 88 and the distal segment 90 typically extend in opposite directions and in a substantially common plane. The distal segments 90 of the respective winding filament units 84c are connected to each other through the bridge segment 92. When mounted in the chamber interior 94 of the arc chamber 93, the filament 82 is separated from the chamber wall 97 on opposite sides of the arc chamber 93 by gaps 96 of the same magnitude. Accordingly, the winding configuration of the filament 82, in combination with the gaps 96 of equal spacing between the chamber wall 97 and each side of the filament 82, facilitate balanced voltages between the chamber wall 97 and the filament 82, resulting in prolonged lifetime of the filament 82.

Referring again to FIGS. 2–4A, the filament 42 heretofore described with respect to FIGS. 2 and 2A includes two symmetrical winding filament units 44 each having one bend 47. The filament 62 of FIGS. 3 and 3A includes a winding filament unit 64a and a winding filament unit 64b on each side of the plane of symmetry 71, with each winding filament unit 64a having one proximal bend 67 and each winding filament unit 64b having one distal bend 69. The filament 82 of FIGS. 4 and 4A has three winding filament units 84a, 84b, 84c on each side of the plane of symmetry 95. Each winding filament unit 84a has one proximal bend 87, each winding filament unit 84b has one middle bend 89, and each winding filament unit 84c has one distal bend 91. It is understood that additional embodiments (not shown) of the filament are possible in which four or more winding filament units each having one filament bend are provided on each side of a plane of symmetry bisecting the filament.

While the preferred embodiments of the invention have been described above, it will be recognized and understood that various modifications can be made in the invention and the appended claims are intended to cover all such modifications which may fall within the spirit and scope of the invention.

What is claimed is:

1. An arc chamber filament for an ion implanter, comprising:
   a pair of parallel segments;
   at least one winding filament unit carried by each of said pair of parallel segments; and
   a bridge segment connecting said at least one winding filament unit of one of said pair of parallel segments to said at least one winding filament unit of an other of said pair of parallel segments.

2. The filament of claim 1 wherein said at least one winding filament unit comprises a first generally U-shaped winding filament unit carried by said one of said pair of parallel segments and a second generally U-shaped winding filament unit carried by said other of said pair of parallel segments.

3. The filament of claim 1 wherein said at least one winding filament unit of said one of said pair of parallel segments is substantially symmetrical with said at least one winding filament unit of said other of said pair of parallel segments.

4. The filament of claim 3 wherein said at least one winding filament unit comprises a first generally U-shaped winding filament unit carried by said one of said pair of parallel segments and a second generally U-shaped winding filament unit carried by said other of said pair of parallel segments.

5. The filament of claim 1 wherein said at least one winding filament unit of said one of said pair of parallel segments and said at least one winding filament unit of said other of said pair of parallel segments are generally coplanar.

6. The filament of claim 5 wherein said at least one winding filament unit comprises a first generally U-shaped winding filament unit carried by said one of said pair of parallel segments and a second generally U-shaped winding filament unit carried by said other of said pair of parallel segments.

7. The filament of claim 5 wherein said at least one winding filament unit of said one of said pair of parallel segments is substantially symmetrical with said at least one winding filament unit of said other of said pair of parallel segments.

8. The filament of claim 7 wherein said at least one winding filament unit comprises a first generally U-shaped winding filament unit carried by said one of said pair of parallel segments and a second generally U-shaped winding filament unit carried by said other of said pair of parallel segments.

9. An arc chamber filament for an ion implanter, comprising:

a pair of parallel segments;

at least two winding filament units carried by each of said pair of parallel segments; and a bridge segment connecting said at least two winding filament units of one of said pair of parallel segments to said at least two winding filament units of an other of said pair of parallel segments.

10. The filament of claim 9 wherein said at least two winding filament units comprises a first generally U-shaped winding filament unit and a second generally U-shaped winding filament unit carried by said one of said pair of parallel segments and a third generally U-shaped winding filament unit and a fourth generally U-shaped winding filament unit carried by said other of said pair of parallel segments.

11. The filament of claim 9 wherein said at least two winding filament units of said one of said pair of parallel segments is substantially symmetrical with said at least two winding filament units of said other of said pair of parallel segments.

12. The filament of claim 11 wherein said at least two winding filament units comprises a first generally U-shaped winding filament unit and a second generally U-shaped winding filament unit carried by said one of said pair of parallel segments and a third generally U-shaped winding filament unit and a fourth generally U-shaped winding filament unit carried by said other of said pair of parallel segments.

13. The filament of claim 9 wherein said at least two winding filament units of said one of said pair of parallel segments and said at least two winding filament units of said other of said pair of parallel segments are generally coplanar.

14. The filament of claim 13 wherein said at least two winding filament units comprises a first generally U-shaped winding filament unit and a second generally U-shaped winding filament unit carried by said one of said pair of parallel segments and a third generally U-shaped winding filament unit and a fourth generally U-shaped winding filament unit carried by said other of said pair of parallel segments.

15. The filament of claim 13 wherein said at least two winding filament units of said one of said pair of parallel segments is substantially symmetrical with said at least two winding filament units of said other of said pair of parallel segments.

16. The filament of claim 15 wherein said at least two winding filament units comprises a first generally U-shaped winding filament unit and a second generally U-shaped winding filament unit carried by said one of said pair of parallel segments and a third generally U-shaped winding filament unit and a fourth generally U-shaped winding filament unit carried by said other of said pair of parallel segments.

17. An arc chamber filament for an ion implanter, comprising:

a pair of parallel segments;

at least three winding filament units carried by each of said pair of parallel segments; and a bridge segment connecting said at least three winding filament units of one of said pair of parallel segments to said at least three winding filament units of an other of said pair of parallel segments.

18. The filament of claim 17 wherein said at least three winding filament units comprises a first generally U-shaped winding filament unit, a second generally U-shaped winding filament unit and a third generally U-shaped winding filament unit carried by said one of said pair of parallel segments and a fourth generally U-shaped winding filament unit, a fifth generally U-shaped winding filament unit and a sixth generally U-shaped winding filament unit carried by said other of said pair of parallel segments.

19. The filament of claim 18 wherein said first, second and third winding filament units of said one of said pair of parallel segments are substantially symmetrical with said fourth, fifth and sixth winding filament units of said other of said pair of parallel segments.

20. The filament of claim 18 wherein said first, second and third winding filament units of said one of said pair of parallel segments and said fourth, fifth and sixth winding filament units of said other of said pair of parallel segments are generally coplanar.

* * * * *